United States Patent
Sun

(10) Patent No.: US 12,494,462 B2
(45) Date of Patent: Dec. 9, 2025

(54) SPLICING DISPLAY PANEL INCLUDING CONNECTING LINE LAYER

(71) Applicant: TCL CHINA STAR OPTOELECTRONICS TECHNOLOGY CO., LTD., Guangdong (CN)

(72) Inventor: Hejing Sun, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/755,530

(22) PCT Filed: Apr. 15, 2022

(86) PCT No.: PCT/CN2022/087092
§ 371 (c)(1),
(2) Date: Apr. 29, 2022

(87) PCT Pub. No.: WO2023/178762
PCT Pub. Date: Sep. 28, 2023

(65) Prior Publication Data
US 2024/0170465 A1  May 23, 2024

(30) Foreign Application Priority Data
Mar. 25, 2022 (CN) .......... 202210307389.9

(51) Int. Cl.
*H10K 59/18* (2023.01)
*H01L 23/00* (2006.01)
(Continued)

(52) U.S. Cl.
CPC ............ *H01L 25/167* (2013.01); *H01L 24/32* (2013.01); *H01L 25/162* (2013.01);
(Continued)

(58) Field of Classification Search
CPC ..... H01L 25/167; H01L 25/162; H01L 24/32; H01L 33/62; H01L 33/08; H01L 27/156;
(Continued)

(56) References Cited

U.S. PATENT DOCUMENTS 9,111,841 B2 * 8/2015 Yamazaki .............. H10K 59/40
11,094,861 B2 * 8/2021 Yang ................... H01L 25/0753
(Continued)

FOREIGN PATENT DOCUMENTS

| CN | 109888085 A | 6/2019 |
| CN | 111933653 A | 11/2020 |

(Continued)

OTHER PUBLICATIONS

International Search Report in International application No. PCT/CN2022/087092, mailed on Dec. 21, 2022.
(Continued)

*Primary Examiner* — Ida M Soward
(74) *Attorney, Agent, or Firm* — PV IP PC; Wei Te Chung

(57) ABSTRACT

A splicing display panel is provided. In the present application, at least two light-emitting diode (LED) substrates are disposed on a driving substrate. The driving substrate includes a first conductive pad and a power signal line disposed on a first base. In each LED substrate, a connecting line layer is disposed on a second base and is electrically connected to the power signal line, and LED elements are disposed on the second base, wherein a first electrode of the LED element is electrically connected to the connecting line layer, and a second electrode of the LED element is electrically connected to the first conductive pad.

20 Claims, 4 Drawing Sheets

(51) Int. Cl.
*H01L 25/16* (2023.01)
*H10H 20/813* (2025.01)
*H10H 29/14* (2025.01)
*H10K 59/127* (2023.01)

(52) U.S. Cl.
CPC ............... *H01L 2224/32052* (2013.01); *H01L 2224/32225* (2013.01); *H01L 2924/1426* (2013.01); *H10H 20/813* (2025.01); *H10H 29/142* (2025.01); *H10K 59/127* (2023.02); *H10K 59/18* (2023.02)

(58) Field of Classification Search
CPC . H01L 2224/32052; H01L 2224/32225; H01L 2924/1426; H01L 23/5385; H01L 25/0753; G09F 9/33; G09F 9/302; H10H 20/813; H10H 29/142; H10H 20/857; H10K 59/18; H10K 59/127
See application file for complete search history.

(56) References Cited

U.S. PATENT DOCUMENTS

| | | | |
|---|---|---|---|
| 11,239,122 B2* | 2/2022 | Jung | H10D 86/0212 |
| 11,710,813 B2* | 7/2023 | Lee | H10H 20/857 257/79 |
| 11,737,330 B2* | 8/2023 | Kong | H10K 50/854 345/1.3 |
| 11,900,838 B2* | 2/2024 | Kim | H01L 25/167 |
| 11,910,682 B2* | 2/2024 | Jeon | H10K 59/131 |
| 12,207,515 B2* | 1/2025 | Yoo | H10K 59/121 |
| 2011/0050657 A1* | 3/2011 | Yamada | H10K 50/84 361/679.01 |
| 2011/0260949 A1* | 10/2011 | Ahn | H01J 11/44 345/1.3 |
| 2014/0138643 A1* | 5/2014 | Choi | H10K 59/121 257/40 |
| 2015/0228704 A1* | 8/2015 | Miyake | H01K 1/00 257/40 |
| 2017/0154947 A1* | 6/2017 | Nakamura | H10K 59/8722 |
| 2018/0151539 A1* | 5/2018 | Nakamura | H10K 59/18 |
| 2018/0188579 A1* | 7/2018 | Jeong | G02F 1/133345 |
| 2018/0190631 A1* | 7/2018 | Kim | H10F 77/331 |
| 2018/0315355 A1 | 11/2018 | Hu et al. | |
| 2019/0012957 A1* | 1/2019 | Liu | H01L 25/0753 |
| 2019/0094641 A1* | 3/2019 | Choi | G02F 1/136286 |
| 2020/0051966 A1* | 2/2020 | Lee | H01L 25/18 |
| 2020/0118988 A1* | 4/2020 | Yueh | H10D 86/60 |
| 2020/0312886 A1 | 10/2020 | Yuan et al. | |
| 2021/0043616 A1* | 2/2021 | Jung | H01L 24/83 |
| 2021/0202675 A1* | 7/2021 | Jang | H10K 59/18 |
| 2021/0313498 A1* | 10/2021 | Kim | H10D 30/6723 |
| 2021/0359081 A1* | 11/2021 | Kong | H10K 59/38 |
| 2021/0384177 A1 | 12/2021 | Liu et al. | |
| 2022/0052022 A1* | 2/2022 | Yu | H01L 24/33 |
| 2022/0102476 A1* | 3/2022 | Kim | H10H 20/851 |
| 2022/0115495 A1* | 4/2022 | Shin | H10K 59/871 |
| 2022/0141964 A1* | 5/2022 | Lin | H10H 20/01 174/260 |
| 2022/0208949 A1* | 6/2022 | Kang | H10K 59/18 |

FOREIGN PATENT DOCUMENTS

| | | |
|---|---|---|
| CN | 112259592 A | 1/2021 |
| CN | 112366214 A | 2/2021 |
| CN | 112562526 A | 3/2021 |
| CN | 112748612 A | 5/2021 |
| CN | 113363295 A | 9/2021 |
| CN | 113674623 A | 11/2021 |
| CN | 113721398 A | 11/2021 |
| CN | 114188381 A | 3/2022 |
| WO | 2006057801 A2 | 6/2006 |

OTHER PUBLICATIONS

Written Opinion of the International Search Authority in International application No. PCT/CN2022/087092, mailed on Dec. 21, 2022.
Chinese Office Action issued in corresponding Chinese Patent Application No. 202210307389.9 dated Oct. 25, 2022, pp. 1-8.

* cited by examiner

SPLICING DISPLAY PANEL INCLUDING CONNECTING LINE LAYER

FIELD OF INVENTION

The present application relates to a field of display technology, and particularly relate to a splicing display panel.

BACKGROUND OF INVENTION

Currently, most large-size light-emitting diode (LED) displays are realized by splicing small-size LED displays. As a result, there are too many chip-on-films provided between small-sized LED panels, which will cause an entire splicing panel have too many and too large seams.

Technical Problem

Embodiments of the present application provide a splicing display panel, which can reduce seams, or even achieve no seams.

SUMMARY OF INVENTION

Embodiments of the present application provide a splicing display panel, which includes: a driving substrate, wherein the driving substrate includes a first base, a first conductive pad, and a power signal line disposed on the first base; and at least two light-emitting diode (LED) substrates, wherein the at least two LED substrates are disposed on the driving substrate, and wherein each LED substrate includes: a second base; a connecting line layer disposed on a side of the second base close to the driving substrate, wherein the connecting line layer is electrically connected to the power signal line; and LED elements arranged on the side of the second base close to the driving substrate, wherein one of the LED elements includes a first electrode, a light-emitting layer, and a second electrode stacked in sequence, the first electrode is electrically connected to the connecting line layer, and the second electrode is electrically connected to the first conductive pad; wherein the connecting line layer includes first connecting lines and second connecting lines connected to each other, one end of one of the first connecting lines is connected to one of the LED elements, and another end of the first connecting line is connected to one of the second connecting lines; wherein the second connecting lines are arranged at intervals along a first direction, a plurality of the LED elements are arranged between two adjacent ones of the second connecting lines; one of the second connecting lines is correspondingly connected to a plurality of the first connecting lines, and the second connecting lines are electrically connected to the power signal line; wherein the driving substrate further includes a thin film transistor disposed on the first base and a planarization layer disposed on the thin film transistor, wherein the planarization layer is defined with an opening exposing the first conductive pad, and wherein the first conductive pad is electrically connected to the thin film transistor; and wherein the LED elements are arranged in the opening.

Optionally, in some embodiments of the present application, the connecting line layer further includes third connecting lines, and the third connecting lines and the second connecting lines are arranged to intersect to form pixel regions; and wherein the LED elements are arranged in the pixel regions; and wherein the third connecting lines are connected to the second connecting lines and are electrically connected to the power signal line.

Optionally, in some embodiments of the present application, the connecting line layer further includes at least one second conductive pad connected to an end of one of the second connecting lines and arranged opposite to the power signal line, and wherein the second conductive pad is electrically connected to the power signal line. Optionally, in some embodiments of the present application, the connecting line layer further includes at least one third conductive pad connected to an end of one of the third connecting lines and arranged opposite to the power signal line, and wherein the third conductive pad is electrically connected to the power signal line.

Optionally, in some embodiments of the present application, the connecting line layer further includes fourth connecting lines arranged on an edge region of the second base, wherein an extension direction of the fourth connecting lines is parallel to an extension direction of the third connecting lines, and wherein one of the fourth connecting lines is connected to an end of one of the second connecting lines; and wherein the fourth connecting line is arranged opposite to the power signal line and is electrically connected to the power signal line.

Optionally, in some embodiments of the present application, the connecting line layer further includes fifth connecting lines arranged on the edge region of the second base, wherein an extension direction of the fifth connecting lines is parallel to an extension direction of the second connecting lines, and wherein one of the fifth connecting lines is connected to an end of one of the third connecting lines and is connected to one of the fourth connecting lines; and wherein the fifth connecting line is arranged opposite to the power signal line and is electrically connected to the power signal line.

Optionally, in some embodiments of the present application, the connecting line layer further includes at least one second conductive pad and at least one third conductive pad, and wherein the second conductive pad is arranged between two adjacent second connecting lines and is connected to an end of one of the second connecting lines through one of the fourth connecting lines; wherein the third conductive pad is arranged between two adjacent third connecting lines and is connected to an end of one of the third connecting lines through one of the fifth connecting lines; and wherein the second conductive pad is arranged opposite to the power signal line and is electrically connected to the power signal line, and the third conductive pad is arranged opposite to the power signal line and is electrically connected to the power signal line.

The embodiment of the present application further provides a splicing display panel, which includes: a driving substrate, wherein the driving substrate includes a first base, a first conductive pad, and a power signal line disposed on the first base; and at least two LED substrates, wherein the at least two LED substrates are disposed on the driving substrate, and wherein each LED substrate includes: a second base; a connecting line layer disposed on a side of the second base close to the driving substrate, wherein the connecting line layer is electrically connected to the power signal line; and LED elements arranged on the side of the second base close to the driving substrate, wherein one of the LED elements includes a first electrode, a light-emitting layer, and a second electrode stacked in sequence, the first electrode is electrically connected to the connecting line layer, and the second electrode is electrically connected to the first conductive pad.

Optionally, in some embodiments of the present application, the connecting line layer includes first connecting lines and second connecting lines connected to each other; wherein one end of one of the first connecting lines is connected to one of the LED elements, and another end of the first connecting line is connected to one of the second connecting lines; wherein the second connecting lines are arranged at intervals along a first direction, wherein a plurality of the LED elements are arranged between two adjacent ones of the second connecting lines; and wherein one of the second connecting lines is correspondingly connected to a plurality of the first connecting lines, and the second connecting line is electrically connected to the power signal line.

Optionally, in some embodiments of the present application, the connecting line layer further includes third connecting lines, wherein the third connecting lines and the second connecting lines are arranged to intersect to form pixel regions; wherein the LED elements are arranged in the pixel regions; and wherein the third connecting lines are connected to the second connecting lines and are electrically connected to the power signal line.

Optionally, in some embodiments of the present application, the connecting line layer further includes at least one second conductive pad connected to an end of one of the second connecting lines and arranged opposite to the power signal line, and wherein the second conductive pad is electrically connected to the power signal line.

Optionally, in some embodiments of the present application, the connecting line layer further includes at least one third conductive pad connected to an end of one of the third connecting lines and arranged opposite to the power signal line, and wherein the third conductive pad is electrically connected to the power signal line.

Optionally, in some embodiments of the present application, the connecting line layer further includes fourth connecting lines arranged on an edge region of the second base, wherein an extension direction of the fourth connecting lines is parallel to an extension direction of the third connecting lines, and wherein one of the fourth connecting lines is connected to an end of one of the second connecting lines; and wherein the fourth connecting line is arranged opposite to the power signal line and is electrically connected to the power signal line.

Optionally, in some embodiments of the present application, the connecting line layer further includes fifth connecting lines arranged on the edge region of the second base, wherein an extension direction of the fifth connecting lines is parallel to an extension direction of the second connecting lines; wherein the fifth connecting line is connected to an end of one of the third connecting lines and is connected to one of the fourth connecting lines; and wherein the fifth connecting line is arranged opposite to the power signal line and is electrically connected to the power signal line.

Optionally, in some embodiments of the present application, the connecting line layer further includes at least one second conductive pad and at least one third conductive pad, wherein the second conductive pad is arranged between two adjacent second connecting lines and is connected to an end of one of the second connecting lines through one of the fourth connecting lines; wherein the third conductive pad is arranged between two adjacent third connecting lines and is connected to an end of one of the third connecting lines through one of the fifth connecting lines; and wherein the second conductive pad is arranged opposite to the power signal line and is electrically connected to the power signal line, and the third conductive pad is arranged opposite to the power signal line and is electrically connected to the power signal line.

Optionally, in some embodiments of the present application, a width of one of the fourth connecting lines and a width of one of the fifth connecting lines are both greater than a width of one of the second connecting lines and a width of one of the third connecting lines.

Optionally, in some embodiments of the present application, the power signal line is arranged on an edge region of the first base and includes a bonding portion electrically connected to the second conductive pad through a conductive adhesive.

Optionally, in some embodiments of the present application, the driving substrate further includes a bonding pad connected to a side of the power signal line away from the first conductive pad, and wherein the bonding pad is configured to be bonded with a chip-on-film.

Optionally, in some embodiments of the present application, the driving substrate further includes a thin film transistor disposed on the first base and a planarization layer disposed on the thin film transistor, wherein the planarization layer is defined with an opening exposing the first conductive pad, wherein the first conductive pad is electrically connected to the thin film transistor; and wherein the LED elements are arranged in the opening.

The splicing display panel according to the embodiment of the present application includes a driving substrate and at least two LED substrates, and the at least two LED substrates are disposed on a driving substrate. The driving substrate includes a first base, and first conductive pads and power signal lines disposed on the first substrate.

Advantages

Each of the light-emitting diode (LED) substrates includes a second substrate, a connecting line layer, and LED elements. The connecting line layer is disposed on a side of the second base close to a driving substrate, the connecting line layer is electrically connected to the power signal line, and a plurality of the LED elements are arranged on the side of the second base close to the driving substrate. The LED element includes a first electrode, a light-emitting layer, and a second electrode stacked in sequence, wherein the first electrode is electrically connected to the connecting line layer, and the second electrode is electrically connected to the first conductive pad.

In the splicing display panel of the present application, at least two LED substrates are spliced on a driving substrate, and the power signal line of the driving substrate is electrically connected to the first electrodes of the LED elements on the at least two LED substrates, which realizes one driving substrate drives at least two LED substrates. This reduces the number of chip-on-films used, thereby reducing seams, or even achieving the effect of no seams.

DESCRIPTION OF DRAWINGS

In order to illustrate the technical solutions in the embodiments of the present application more clearly, the following briefly introduces the drawings that need to be used in the description of the embodiments. Obviously, the drawings in the following description are only some embodiments of the present application, and for one skilled in the art, other drawings can also be obtained from these drawings without creative effort.

DETAILED DESCRIPTION OF PREFERRED EMBODIMENTS

Figure 1:
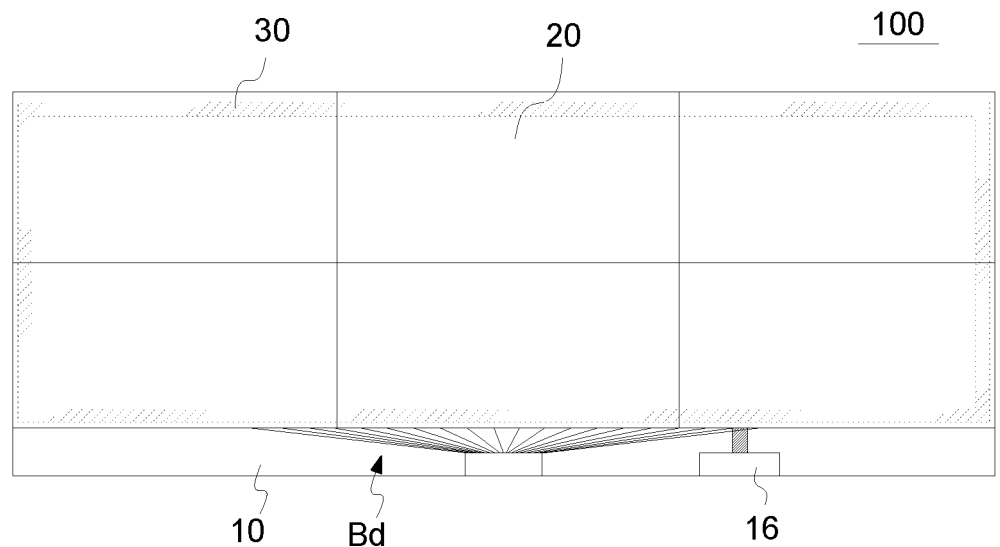
FIG. 1 is a schematic top-view structural diagram of a splicing display panel provided by a first embodiment of the present application.

The technical solutions in the embodiments of the present application will be clearly described with reference to the drawings in the embodiments of the present application. Obviously, the embodiments are only some but not all the embodiments of the present application. Based on these embodiments in the present application, all other embodiments obtained by one skilled in the art without creative work fall within the protection scope of the present application. In addition, the specific embodiments described herein are only used to illustrate and explain the present application, but not to limit the present application. In this application, unless otherwise stated, the use of directional words such as "upper" and "lower" generally refers to the upper and lower parts of the device in actual use or working state. Specifically, the orientation in the drawings, while "inside" and "outside" refer to the outline of the device.

Embodiments of the present application provide a splicing display panel, which will be described in detail below. It should be noted that the description order of the embodiments is not intended to limit the preferred order of the embodiments.

Figure 2:
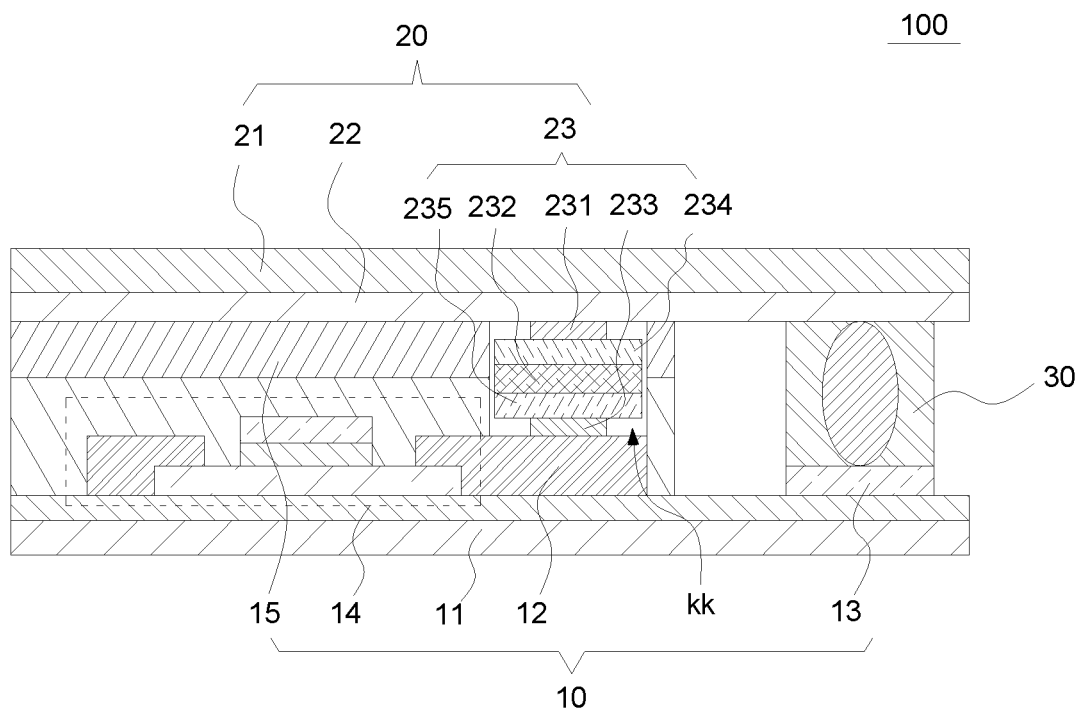
FIG. 2 is a schematic cross-sectional diagram of the splicing display panel provided by the first embodiment of the present application.
Figure 3:
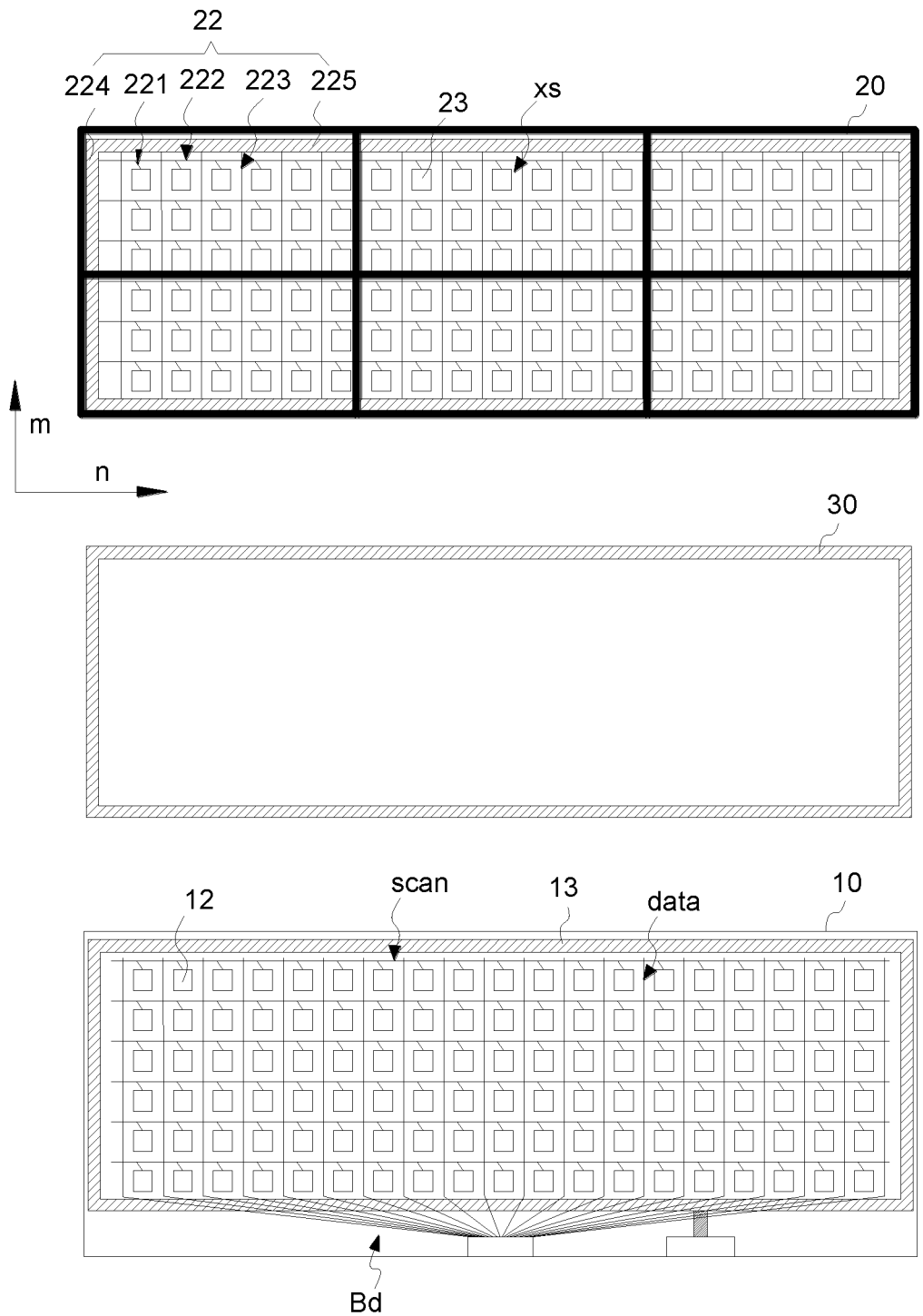
FIG. 3 is an exploded view of the splicing display panel provided by the first embodiment of the present application.

Please refer to FIG. 1 to FIG. 3. An embodiment of the present application provides a splicing display panel 100, which includes a driving substrate 10 and at least two light-emitting diode (LED) substrates 20. At least two LED substrates 20 are disposed on a driving substrate 10. The driving substrate 10 includes a first base 11, a first conductive pad 12, and a power signal line 13 disposed on the first base 11.

Each LED substrate 20 includes a second base 21, a connecting line layer 22, and a plurality of LED elements 23. The connecting line layer 22 is disposed on a side of the second base 21 close to the driving substrate 10. The connecting line layer 22 is electrically connected to a power signal line 13. A plurality of LED elements 23 are disposed on a side of the second base 21 close to the driving substrate 10. The LED element 23 includes a first electrode 231, a light-emitting layer 232, and a second electrode 233 stacked in sequence. The first electrode 231 is electrically connected to the connecting line layer 22, and the second electrode 233 is electrically connected to the first conductive pad 12.

In the splicing display panel 100 of the present application, at least two LED substrates 20 are spliced on a driving substrate 10, and the power signal line 13 of the driving substrate 10 is electrically connected to the first electrodes 231 of the LED elements 23 on the at least two LED substrates 20, which realizes one driving substrate 10 drives at least two LED substrates 20. This reduces the number of chip-on-films used, thereby reducing seams, or even achieving the effect of no seams.

Optionally, the driving substrate 10 further includes a thin film transistor 14 disposed on the first base 11 and a planarization layer 15 disposed on the thin film transistor 14. The planarization layer 15 is defined with openings kk. The opening kk exposes the first conductive pad 12. The first conductive pad 12 is electrically connected to the thin film transistor 14.

The LED elements 23 is arranged in the openings kk.

Arranging the LED element 23 in the opening kk not only achieves the effect of reducing the thickness of the splicing display panel 100 but also improves the alignment accuracy of the LED substrates 20 and the driving substrate 10.

Optionally, the thin film transistor 14 includes a gate electrode, a source electrode, and a drain electrode, wherein the first conductive pad 12 is electrically connected to the drain electrode or the source electrode. The first conductive pad 12 may be disposed in the same layer or in a different layer with the source electrode.

The thin film transistor 14 may be a top-gate type, a bottom-gate type, or a double-gate type, which will not be clearly described herein.

Optionally, the LED element 23 may be a sub-millimeter light-emitting diode (Mini-LED) or a micro light-emitting diode (Micro-LED).

Wherein, the LED element 23 further includes an N-type semiconductor layer 234 and a P-type semiconductor layer 235. One of the N-type semiconductor layer 234 or the P-type semiconductor layer 235 is provided between the first electrode 231 and the light-emitting layer 232, and the other of the N-type semiconductor layer 234 or the P-type semiconductor layer 235 is provided between the second electrode 233 and the light-emitting layer 232.

Optionally, the first base 11 and the second base 21 may be a rigid base or a flexible base, respectively. The materials of the first base 11 and the second base 21 may be glass, sapphire, silicon, silica, polyethylene, polypropylene, polystyrene, polylactic acid, polyethylene dicarboxylate, polyethylene terephthalate, polyethylene naphthalate, polycarbonate, polyethersulfone, aromatic fluorotoluene containing polyarylate, polycyclic olefin, polyimide, or polyurethane.

The first conductive pad 12 may include a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), or cobalt (Co). Alternatively, it may be formed of an alloy containing any of the aforesaid metal elements, or an alloy of any of the aforesaid metal elements in combination. In addition, the first conductive pad 12 may have a single-layer structure or a stacked-layer structure of two or more layers.

The power signal line 13 and the connecting line layer 22 each can be selected from the metal elements of chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), or cobalt (Co), or oxides such as indium tin oxide, indium zinc oxide, or alloys or mixtures of any of the aforesaid metal elements.

Optionally, the power signal line 13 may be a VSS line.

Optionally, the power signal line 13 may be provided in the same layer as the gate electrode or the source electrode, or may be provided in a different layer with the gate electrode or the source electrode.

The material of the planarization layer 15 can be an organic transparent film layer, such as transparent photoresist, epoxy resin, polyimide, polyvinyl alcohol, polymethyl methacrylate, polystyrene, etc. It may also be an inorganic transparent film layer.

Figure 4:
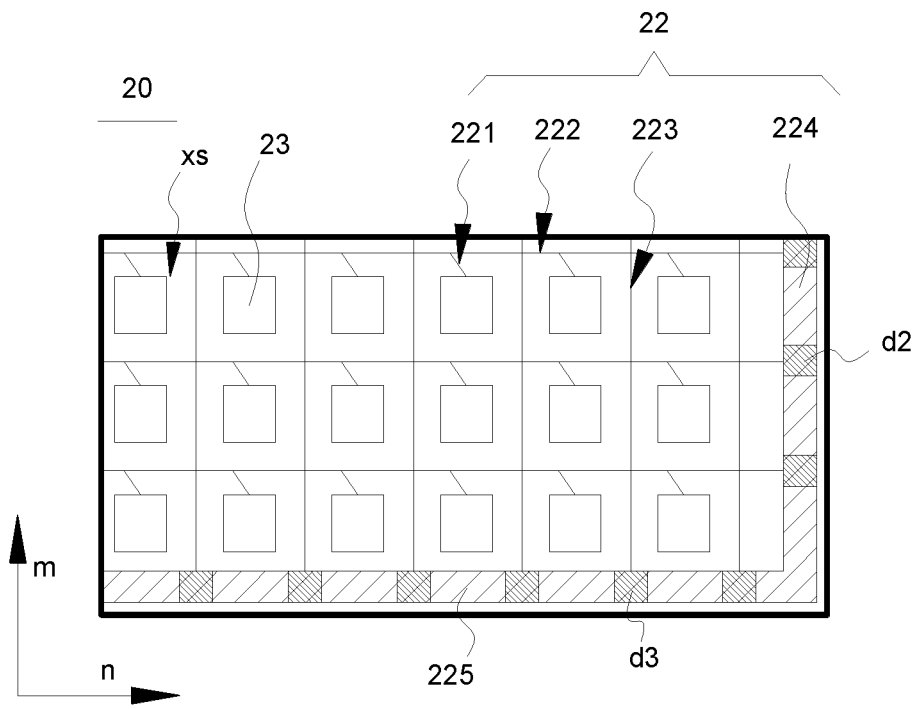
FIG. 4 is a schematic top-view structural diagram of a light-emitting diode (LED) substrate of the splicing display panel provided by the first embodiment of the present application.

Please refer to FIG. 3 and FIG. 4, the connecting line layer 22 includes a first connecting line 221 and a second connecting line 222, and the first connecting line 221 is connected to the second connecting line 222.

One end of the first connecting line 221 is connected to the LED element 23, and the other end of the first connecting line 221 is connected to the second connecting line 222.

The second connecting lines 222 are arranged at intervals along the first direction m. The second connecting line 222 extends along the second direction n. A plurality of LED elements 23 are arranged between two adjacent second connecting lines 222. One second connecting line 222 is correspondingly connected to a plurality of first connecting lines 221.

The second connecting line 222 is electrically connected to the power signal line 13.

Optionally, in the first embodiment, the LED elements 23 are arranged in a matrix. One of the second connecting lines 222 is electrically connected to at least one row of the LED elements 23.

Optionally, as shown in FIG. 4, in the first embodiment, the connecting line layer 22 may further include at least one second conductive pad d2. The second conductive pad d2 is connected to an end of the second connecting line 222 and is disposed opposite to the power signal line 13. The second conductive pad d2 is electrically connected to the power signal line 13.

Optionally, the connecting line layer 22 may further include a plurality of third connecting lines 223. The third connecting lines 223 and the second connecting lines 222 are cross-connected to form a plurality of pixel regions xs. The LED element 23 is arranged in the pixel region xs.

The third connecting line 223 is connected to the second connecting line 222 and is electrically connected to the power signal line 13.

The third connecting line 223 and the second connecting line 222 are cross-connected to form a plurality of pixel regions xs to arrange the LED elements 23. On the one hand, the third connecting line 223 and the second connecting line 222 are cross-connected to facilitate the splicing of the LED substrate 20. On the other hand, even if a certain connecting line is damaged, the electrical connection of the LED elements 23 can be guaranteed.

Optionally, the connecting line layer 22 may further include at least one third conductive pad d3. The third conductive pad d3 is connected to the end of the third connecting line 223 and is disposed opposite to the power signal line 13. The third conductive pad d3 is electrically connected to the power signal line 13.

That is, the second conductive pad d2 and the third conductive pad d3 are electrically connected to the power signal line 13 in two different directions to ensure the stability of the electrical connection between the LED substrate 20 and the driving substrate 10.

Optionally, in the first embodiment, the power signal line 13 is provided in the edge region of the first substrate 11.

The driving substrate 10 further includes scan lines (scan) and data lines (data), and the scan lines (scan) and data lines (data) are arranged in the middle region. That is, the power signal lines 13 are arranged around the middle region.

Figure 5:
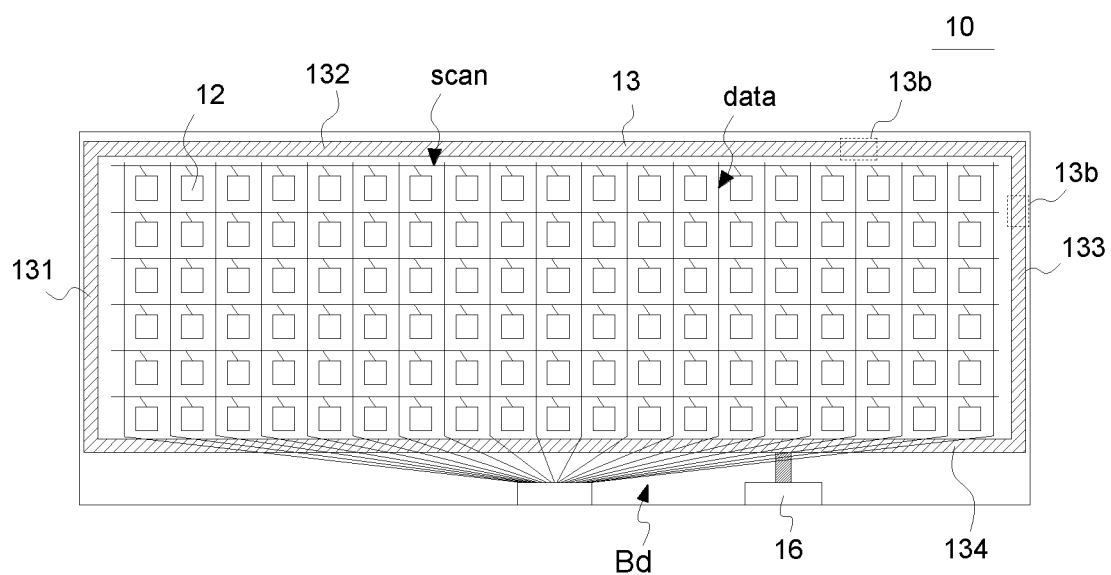
FIG. 5 is a schematic top-view structural diagram of a drive substrate of the splicing display panel provided by the first embodiment of the present application.

Please refer to FIG. 5, FIG. 2, and FIG. 3, the power signal line 13 includes a bonding portion 13b. The bonding portion 13b is electrically connected to the second conductive pad d2 through the conductive adhesive 30 and is electrically connected to the third conductive pad d3 through the conductive adhesive 30.

The width of the power signal line 13 is greater than the width of the second connecting line 222 and the width of the third connecting line 223 to reduce impedance.

Optionally, the connecting line layer 22 may further include a fourth connecting line 224. The fourth connecting line 224 is disposed on the edge region of the second substrate 21. The extension direction of the fourth connecting line 224 is parallel to the extension direction of the third connecting line 223. The fourth connecting line 224 is connected to the end of the second connecting line 222.

The fourth connecting line 224 is arranged opposite to the power signal line 13 and is electrically connected to the power signal line 13.

Wherein, the second conductive pad d2 is arranged at the junction of the fourth connecting line 224 and the second connecting line 222.

Optionally, the connecting line layer 22 may further include a fifth connecting line 225. The fifth connecting line 225 is arranged on the edge region of the second substrate 21. The extension direction of the fifth connecting line 225 is parallel to the extension direction of the second connecting line 222. The fifth connecting line 225 is connected to the end of the third connecting line 223 and is connected to the fourth connecting line 224.

The fifth connecting line 225 is arranged opposite to the power signal line 13 and is electrically connected to the power signal line 13.

The third conductive pad d3 is disposed at the junction of the fifth connecting line 225 and the third connecting line 223.

The arrangement of the fourth connecting line 224 and the fifth connecting line 225 causes the connection of the entire connecting line layer 22 more stable and has more options for electrical connection.

Wherein, the widths of the fourth connecting line 224 and the fifth connecting line 225 are the same, and the widths of the fourth connecting line 224 and the fifth connecting line 225 are both equal to the widths of the second connecting line 222 and the third connecting line 223 to reduce impedance and facilitate signal transmission.

Please refer to FIG. 3, the third conductive pad d3 is bonded to the bonded portion 13b of the power signal line 13 through the conductive adhesive 30. The conductive adhesive 30 may cover the peripheral region of the driving substrate 10 to form a closed structure to achieve the effect of encapsulation.

Optionally, the conductive adhesive 30 is consistent with the extending direction of the power signal line 13. The conductive adhesive 30 and the power signal line 13 are arranged to overlap with the fourth connecting line 224, and the conductive adhesive 30 and the power signal line 13 are also arranged to overlap with the fifth connecting line 225. That is, the conductive adhesive 30 is arranged between the power signal line 13 and the fourth connecting line 224, and the conductive adhesive 30 is arranged between the power signal line 13 and the fifth connecting line 225.

Since the conductive adhesive 30 is a closed ring structure, the conductive adhesive 30 is used not only for bonding the LED substrate 20 and the driving substrate 10 but also for encapsulating the peripheral edges of the LED substrate 20 and the driving substrate 10.

Optionally, please refer to FIG. 5, the driving substrate 10 further includes a bonding pad 16. The bonding pad 16 is provided in the bonding region Bd. The bonding pad 16 is connected to a side of the power signal line 13 away from the first conductive pad 12. The bonding pads 16 are used for bonding the chip-on-films.

That is, in the first embodiment, at least two LED substrates 20 can be driven by using one chip-on-film. Compared with the prior art, the number of the chip-on-films is reduced, and even a seamless effect can be achieved.

In addition, the bonding region Bd is also used for bonding the source driver chip or the source driver board. In the first embodiment, the chip-on-film and the source driver are bonded in the same bonding region, which reduces the width of the frame.

Optionally, referring to FIG. 5, the power signal line 13 includes a first segment 131, a second segment 132, a third segment 133, and a fourth segment 134 connected in sequence. The first segment 131, the second segment 132, the third segment 133, and the fourth segment 134 form a closed structure.

The first segment 131 and the third segment 133 are arranged opposite to each other, and the second segment 132 and the fourth segment 134 are arranged opposite to each other. The fourth segment 134 intersects the extension segment of the data line (data) and is insulated from the extension segment of the data line (data).

Wherein, the fourth segment 134 may be arranged at a different layer from the extension segment of the data line (data). Alternatively, the part of the fourth segment 134 that intersects with the extension segment of the data line (data) is arranged on a different layer, and the other part of the fourth segment 134 is arranged on the same layer as the extension segment of the data line (data).

The manufacturing process of the splicing display panel 100 of the first embodiment is described as follows: a driving substrate 10 and at least two LED substrates 20 are provided. Subsequently, the conductive adhesive 30 is formed on the bonding portion 13b of the power signal line 13 of the driving substrate 10. Then, the LED substrate 20 and the driving substrate 10 are aligned, so that the second conductive pad d2 and the third conductive pad d3 correspond to the bonding portion 13b, and the LED element 23 is disposed on the first conductive pad 12. Then, the LED element 23 and the first conductive pad 12 are soldered and the conductive adhesive 30 is cured. This completes the manufacturing process of the first embodiment.

In the first embodiment, a driving substrate 10 splicing 6 LED substrates 20 is taken as an example for a detailed description.

The LED substrates 20 located on both sides of the driving substrate 10 include second conductive pads d2, third conductive pads d3, and first connecting line 221 to fifth connecting line 225. The two LED substrates 20 in the middle of the driving substrate 10 lack the fourth connecting line 224 and the second conductive pad d2.

Wherein, the pattern formed by successively splicing the fourth connecting lines 224 and the fifth connecting lines 225 of the six LED substrates overlaps with the power signal line.

In addition, optionally, among the two LED substrates 20 located in the middle area of the driving substrate 10, the LED substrate 20 close to the bonding region is defined as a near-end LED substrate 20, and the LED substrate 20 away from the bonding region is defined as a far-end LED substrate 20.

Wherein, the length of the third connecting line 223 on the near-end LED substrate 20 is greater than the length of the third connecting line 223 on the far-end LED substrate 20. Since the length of the power signal line 13 from the bonding pad 16 to the near-end LED substrate 20 is smaller than the length of the power signal line 13 from the bonding pad 16 to the far-end LED substrate 20, the time for the signal to reach the far-end LED substrate 20 is longer than that to the near-end LED substrate 20. Therefore, by increasing the length of the third connecting line 223 of the near-end LED substrate 20, the signals to the near-end LED substrate 20 and the far-end LED substrate 20 can be synchronized.

Optionally, the splicing display panel 100 may further include encapsulant. There is a gap between two adjacent LED substrates 20, and the encapsulant is filled in the gap and connected to the driving substrate 10.

Optionally, the connecting line layer 22 includes peripheral lines, and the peripheral lines include fourth connecting lines 224 and fifth connecting lines 225.

Optionally, the splicing display panel 100 may further include conductive lines. In the two adjacent LED substrates 20, conductive lines (not shown) are arranged on the side of the LED substrate 20 close to the driving substrate 10. One end of the conductive line is connected to the peripheral line of one LED substrate 20, and the other end of the conductive line is connected to the peripheral line of another LED substrate 20.

The encapsulant wraps the conductive lines.

The conductive lines connect the peripheral lines on both sides so that all the peripheral lines form an electrical closed loop. This ensures the stability of the electrical connection and reduces the risk of signal delay.

Figure 6:
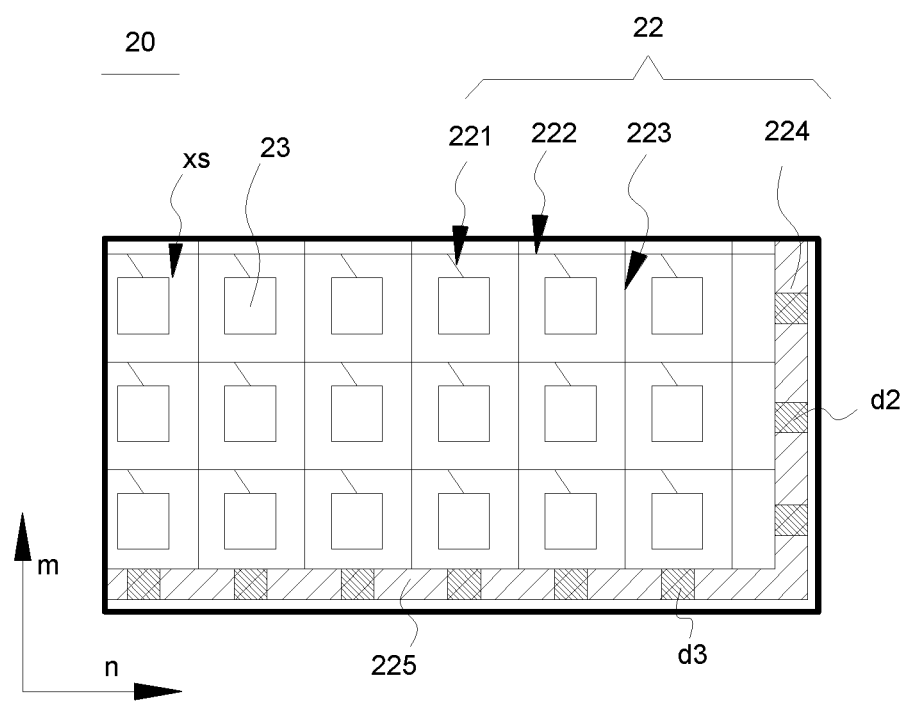
FIG. 6 is a schematic top-view structural diagram of a LED substrate of the splicing display panel provided by a second embodiment of the present application.

Please refer to FIG. 6, the difference between the splicing display panel of the second embodiment and the splicing display panel 100 of the first embodiment is: The second conductive pad d2 is arranged between two adjacent second connecting lines 222 and is connected to the end of the second connecting line 222 through the fourth connecting line 224.

The third conductive pad d3 is arranged between two adjacent third connecting lines 223 and is connected to the end of the third connecting line 223 through the fifth connecting line 225.

The second conductive pad d2 is arranged opposite to the power signal line 13 and is electrically connected to the power signal line 13. The third conductive pad d3 is arranged opposite to the power signal line 13 and is electrically connected to the power signal line 13.

That is, the difference between the second embodiment and the first embodiment is that the positions of the second conductive pad d2 and the third conductive pad d3 are different. Correspondingly, the bonding portion 13b is provided corresponding to the second conductive pad d2 and the third conductive pad d3.

The splicing display panel according to the second embodiment of the present application includes a driving substrate 10 and at least two LED substrates 20. The LED substrates 20 are disposed on the driving substrate 10. The driving substrate 10 includes a first base 11, a first conductive pad 12, and a power signal line 13 disposed on the first base 11.

Each LED substrate 20 includes a second base 21, a connecting line layer 22, and a plurality of LED elements 23. The connecting line layer 22 is disposed on the side of the second base 21 close to the driving substrate 10. The connecting line layer 22 is electrically connected to the power signal line 13. The plurality of LED elements 23 are disposed on the side of the second base 21 close to the driving substrate 10. The LED element 23 includes a first electrode 231, a light-emitting layer 232, and a second electrode 233 stacked in sequence. The first electrode 231 is electrically connected to the connecting line layer 22, and the second electrode 233 is electrically connected to the first conductive pad 12.

In the splicing display panel of the present application, at least two LED substrates 20 are spliced on a driving substrate 10, and the power signal line 13 of the driving substrate 10 is electrically connected to the first electrodes 231 of the LED elements 23 on the at least two LED substrates 20, which realizes one driving substrate drives at least two LED substrates. This reduces the number of chip-on-films used, thereby reducing seams, or even achieving the effect of no seams.

The splicing display panel provided by the embodiments of the present application has been described in detail above. The principles and implementations of the present application are described herein using specific embodiments. The descriptions of the aforesaid embodiments are only used to help understand the methods and core ideas of the present application. In addition, for one skilled in the art, according to the idea of the present application, there will be changes in the specific embodiments and the scope of the present application. In conclusion, the content of this specification should not be construed as a limitation on the present application.

What is claimed is:

1. A splicing display panel including a connecting line layer, comprising:
   a driving substrate, wherein the driving substrate comprises a first base, a first conductive pad, and a power signal line disposed on the first base; and
   at least two LED substrates, wherein the at least two LED substrates are disposed on the driving substrate, and wherein each LED substrate comprises:
   a second base;
   the connecting line layer disposed on a side of the second base close to the driving substrate, wherein the connecting line layer is electrically connected to the power signal line; and
   LED elements arranged on the side of the second base close to the driving substrate, wherein one of the LED elements comprises a first electrode, a light-emitting layer, and a second electrode stacked in sequence, the first electrode is electrically connected to the connecting line layer, and the second electrode is electrically connected to the first conductive pad;
   wherein the connecting line layer comprises first connecting lines and second connecting lines connected to each other, one end of one of the first connecting lines is connected to one of the LED elements, and another end of the first connecting line is connected to one of the second connecting lines;
   wherein the second connecting lines are arranged at intervals along a first direction, a plurality of the LED elements are arranged between two adjacent ones of the second connecting lines; one of the second connecting lines is correspondingly connected to a plurality of the first connecting lines, and the second connecting lines are electrically connected to the power signal line;
   wherein the driving substrate further comprises a thin film transistor disposed on the first base and a planarization layer disposed on the thin film transistor, wherein the planarization layer is defined with an opening exposing the first conductive pad, and wherein the first conductive pad is electrically connected to the thin film transistor; and
   wherein the LED elements are arranged in the opening.

2. The splicing display panel including the connecting line layer of claim 1, wherein the connecting line layer further comprises third connecting lines, wherein the third connecting lines and the second connecting lines are arranged to intersect to form pixel regions; and wherein the LED elements are arranged in the pixel regions; and
   wherein the third connecting lines are connected to the second connecting lines and are electrically connected to the power signal line.

3. The splicing display panel including the connecting line layer of claim 1, wherein the connecting line layer further comprises at least one second conductive pad connected to an end of one of the second connecting lines and arranged opposite to the power signal line, and wherein the at least one second conductive pad is electrically connected to the power signal line.

4. The splicing display panel including the connecting line layer of claim 2, wherein the connecting line layer further comprises at least one third conductive pad connected to an end of one of the third connecting lines and arranged opposite to the power signal line, and wherein the at least one third conductive pad is electrically connected to the power signal line.

5. The splicing display panel including the connecting line layer of claim 2, wherein the connecting line layer further comprises fourth connecting lines arranged on an edge region of the second base, wherein an extension direction of the fourth connecting lines is parallel to an extension direction of the third connecting lines, and wherein one of the fourth connecting lines is connected to an end of one of the second connecting lines; and
   wherein the fourth connecting line is arranged opposite to the power signal line and is electrically connected to the power signal line.

6. The splicing display panel including the connecting line layer of claim 5, wherein the connecting line layer further comprises fifth connecting lines arranged on the edge region of the second base, wherein an extension direction of the fifth connecting lines is parallel to an extension direction of the second connecting lines, and wherein one of the fifth connecting lines is connected to an end of one of the third connecting lines and is connected to one of the fourth connecting lines; and
   wherein the fifth connecting line is arranged opposite to the power signal line and is electrically connected to the power signal line.

7. The splicing display panel including the connecting line layer of claim 6, wherein the connecting line layer further comprises the at least one second conductive pad and at least one third conductive pad, and wherein the at least one second conductive pad is arranged between two adjacent second connecting lines and is connected to an end of one of the second connecting lines through one of the fourth connecting lines;
   wherein the at least one third conductive pad is arranged between two adjacent third connecting lines and is connected to an end of one of the third connecting lines through one of the fifth connecting lines; and
   wherein the at least one second conductive pad is arranged opposite to the power signal line and is electrically connected to the power signal line, and the at least one third conductive pad is arranged opposite to the power signal line and is electrically connected to the power signal line.

8. A splicing display panel including a connecting line layer, comprising:
a driving substrate, wherein the driving substrate comprises a first base, a first conductive pad, and a power signal line disposed on the first base; and
at least two LED substrates, wherein the at least two LED substrates are disposed on the driving substrate, and wherein each LED substrate comprises:
a second base;
the connecting line layer disposed on a side of the second base close to the driving substrate, wherein the connecting line layer is electrically connected to the power signal line; and
LED elements arranged on the side of the second base close to the driving substrate, wherein one of the LED elements comprises a first electrode, a light-emitting layer, and a second electrode stacked in sequence, the first electrode is electrically connected to the connecting line layer, and the second electrode is electrically connected to the first conductive pad.

9. The splicing display panel including the connecting line layer of claim 8, wherein the connecting line layer comprises first connecting lines and second connecting lines connected to each other, one end of one of the first connecting lines is connected to one of the LED elements, and another end of the first connecting line is connected to one of the second connecting lines;
wherein the second connecting lines are arranged at intervals along a first direction, a plurality of the LED elements are arranged between two adjacent ones of the second connecting lines; one of the second connecting lines is correspondingly connected to a plurality of the first connecting lines, and the second connecting lines are electrically connected to the power signal line.

10. The splicing display panel including the connecting line layer of claim 9, wherein the connecting line layer further comprises third connecting lines, wherein the third connecting lines and the second connecting lines are arranged to intersect to form pixel regions; and wherein the LED elements are arranged in the pixel regions; and
wherein the third connecting lines are connected to the second connecting lines and are electrically connected to the power signal line.

11. The splicing display panel including the connecting line layer of claim 9, wherein the connecting line layer further comprises at least one second conductive pad connected to an end of one of the second connecting lines and arranged opposite to the power signal line, and wherein the at least one second conductive pad is electrically connected to the power signal line.

12. The splicing display panel including the connecting line layer of claim 10, wherein the connecting line layer further comprises at least one third conductive pad connected to an end of one of the third connecting lines and arranged opposite to the power signal line, and wherein the at least one third conductive pad is electrically connected to the power signal line.

13. The splicing display panel including the connecting line layer of claim 10, wherein the connecting line layer further comprises fourth connecting lines arranged on an edge region of the second base, wherein an extension direction of the fourth connecting lines is parallel to an extension direction of the third connecting lines, and wherein one of the fourth connecting lines is connected to an end of one of the second connecting lines; and
wherein the fourth connecting line is arranged opposite to the power signal line and is electrically connected to the power signal line.

14. The splicing display panel including the connecting line layer of claim 13, wherein the connecting line layer further comprises fifth connecting lines arranged on the edge region of the second base, wherein an extension direction of the fifth connecting lines is parallel to an extension direction of the second connecting lines, and wherein one of the fifth connecting lines is connected to an end of one of the third connecting lines and is connected to one of the fourth connecting lines; and
wherein the fifth connecting line is arranged opposite to the power signal line and is electrically connected to the power signal line.

15. The splicing display panel including the connecting line layer of claim 14, wherein the connecting line layer further comprises the at least one second conductive pad and at least one third conductive pad, and wherein the at least one second conductive pad is arranged between two adjacent second connecting lines and is connected to an end of one of the second connecting lines through one of the fourth connecting lines;
wherein the at least one third conductive pad is arranged between two adjacent third connecting lines and is connected to an end of one of the third connecting lines through one of the fifth connecting lines; and
wherein the at least one second conductive pad is arranged opposite to the power signal line and is electrically connected to the power signal line, and the at least one third conductive pad is arranged opposite to the power signal line and is electrically connected to the power signal line.

16. The splicing display panel including the connecting line layer of claim 14, wherein a width of one of the fourth connecting lines and a width of one of the fifth connecting lines are both greater than a width of one of the second connecting lines and a width of one of the third connecting lines.

17. The splicing display panel including the connecting line layer of claim 11, wherein the power signal line is arranged on an edge region of the first base and comprises a bonding portion electrically connected to the at least one second conductive pad through a conductive adhesive.

18. The splicing display panel including the connecting line layer of claim 12, wherein the power signal line is arranged on an edge region of the first base and comprises a bonding portion electrically connected to the at least one third conductive pad through a conductive adhesive.

19. The splicing display panel including the connecting line layer of claim 17, wherein the driving substrate further comprises a bonding pad connected to a side of the power signal line away from the first conductive pad, and wherein the bonding pad is configured to be bonded with a chip-on-film.

20. The splicing display panel including the connecting line layer of claim 8, wherein the driving substrate further comprises a thin film transistor disposed on the first base and a planarization layer disposed on the thin film transistor, wherein the planarization layer is defined with an opening exposing the first conductive pad, and wherein the first conductive pad is electrically connected to the thin film transistor; and
wherein the LED elements are arranged in the opening.

* * * * *